(12) United States Patent
Mouli

(10) Patent No.: US 7,057,220 B2
(45) Date of Patent: Jun. 6, 2006

(54) ULTRASHALLOW PHOTODIODE USING INDIUM

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 10/681,108

(22) Filed: Oct. 9, 2003

(65) Prior Publication Data

US 2005/0077586 A1 Apr. 14, 2005

(51) Int. Cl.
*H01L 31/062* (2006.01)
(52) U.S. Cl. .................. 257/292; 257/291; 257/232; 257/234
(58) Field of Classification Search ............... 257/222, 257/225, 292
See application file for complete search history.

(56) References Cited

U.S. PATENT DOCUMENTS

| 2004/0140491 | A1* | 7/2004 | Rhodes et al. | 257/292 |
| 2004/0251398 | A1* | 12/2004 | Mouli et al. | 250/214.1 |
| 2005/0023580 | A1* | 2/2005 | Rhodes | 257/292 |

OTHER PUBLICATIONS

P. Boulon et al., "Anomalous Short Channel Effects in Indium Implanted nMOSFETS," 1997 IEEE.
Y. Lee et al., "Indium Doped nMSOFETs and Buried Channel pMOSFETs wtih n+ Polysilicon Gate," Jpn. J. Appl. Phys. vol. 36 (1997),, pp. 1341-1345.
I. C. Kizilyalli et al., "n+ Polysilicon Gale PMOSFET's with Indium Doped Buried-Channels," IEEE Electron Device Letters, vol. 17 (1996), pp. 46 49.
G. G. Shahidi, "Indium Channel Implants for Improved MOSFET Behavior at the 100-nm Channel Length Regime," IEEE Transactions on Electronic Devices, vol. 38 (1989) p. 2605.
H. Tian et al., "A Comparative Study of Indium and Boron Implanted Silicon Bipolar Transistors," IEEE Transactions on Electron Devices, vol. 48 (2001), pp. 2520-2524.

* cited by examiner

*Primary Examiner*—Luan Thai
(74) *Attorney, Agent, or Firm*—Dickstein Shapiro Morin & Oshinsky LLP

(57) ABSTRACT

The invention provides an imager having a p-n-p photodiode with an ultrashallow junction depth. A p+ junction layer of the photodiode is doped with indium to decrease transient enhanced diffusion effects, minimize fixed pattern noise and fill factor loss.

17 Claims, 7 Drawing Sheets

ULTRASHALLOW PHOTODIODE USING INDIUM

FIELD OF THE INVENTION

The present invention relates generally to image sensors and methods of fabrication thereof and in particular to a p-n-p photodiode having an ultrashallow p+ region doped with indium.

BACKGROUND

Typically, a digital imager circuit includes a focal plane array of pixel cells, each one of the cells including a photoconversion device, e.g. a photogate, a photoconductor, or a photodiode. A CMOS imager is one such digital imager circuit and includes a readout circuit connected to each pixel cell in the form of an output transistor. The photoconversion device converts photons to electrons which are typically transferred to a floating diffusion region, connected to the gate of a source follower output transistor. A charge transfer device can be included as well and may be a transistor for transferring charge from the photoconversion device to the floating diffusion region. Imager cells also typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

FIG. 1 illustrates a block diagram of a CMOS imager device 308 having a pixel array 200 with each pixel cell being constructed as described above. Pixel array 200 comprises a plurality of pixels arranged in a predetermined number of columns and rows (not shown). The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel. The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. A differential signal ($V_{rst}-V_{sig}$) is produced by differential amplifier 262 for each pixel which is amplified and digitized by analog to digital converter 275 (ADC). The analog to digital converter 275 supplies the digitized pixel signals to an image processor 280 which forms a digital image.

In a CMOS imager, when incident light strikes the surface of a photodiode, electron/hole pairs are generated in the p-n junction of the photodiode. The generated electrons are collected in the n-type region of the photodiode. Photo charge may be amplified when it moves from the initial charge accumulation region to the floating diffusion region or it may be transferred to the floating diffusion region via a transfer transistor. The charge at the floating diffusion region is typically converted to a pixel output voltage by the source follower transistor described above.

A conventional CMOS image sensor cell having a p-n-p photodiode is shown in FIG. 2. P-n-p photodiodes are an example of a type of photoconversion device typically used in CMOS image sensors. A p+ region 21 is shown above an n-type region 23 to form the photodiode 49. Typically, the p+ region 21 is implanted to create a p-n junction. A transfer transistor with associated gate 26 and a reset transistor with associated gate 28 are also shown, along with a floating diffusion region 16 and source/drain region 30. A source follower transistor and row select transistor are also included in the 4-transistor (4-T) cell of FIG. 2, but are not shown in the cross-section depicted.

Imagers having p-n-p photodiodes may suffer from problems such as inefficient charge transfer and image lag due to potential barriers between the. photodiode 49 and transfer gate 26 region. Fill factor loss is also a problem associated with CMOS image sensors. Fill factor is a measure of the ratio of electrons produced per given light intensity. Fill factor loss may occur when higher concentrations of p-type dopants are used in the surface of a p-n-p photodiode and diffuse into n-type dopants, thereby compensating them and causing a reduction in fill factor.

Another problem associated with CMOS image sensors is fixed pattern noise which causes static in the image due to pixel to pixel variations. Fixed pattern noise is created by a mismatch between transistor parametrics and photodiode characteristics between adjacent pixels. Variation in pinned voltage ($V_{PIN}$) and variation in barrier height in the photodiode/transfer gate region also cause an increase in fixed pattern noise.

In order to address the problems discussed above, some CMOS image sensors employ an ultra-shallow p-n junction where the p+ region of a p-n-p photodiode is implanted at a very shallow depth, close to the surface of the substrate. Some advantages of an ultrashallow p-n junction are the ability to decrease the size of the pixel and improve responsivity for colors, such as blue, with a shorter wavelength. Shallow p-n junctions may also minimize fixed pattern noise problems by keeping the $V_{PIN}$ variations from pixel to pixel to a minimum.

Ultrashallow p-n junctions have typically been formed using boron as the dopant in the p+ region. However, damage during ion implantation can cause boron dopants to diffuse by transient enhanced diffusion (TED). As a consequence of TED, silicon interstitials are created when silicon atoms are dislodged from the crystal lattice and the implanted boron dopants diffuse into the substrate farther than the intended implant area. Transient enhanced diffusion is a problem associated with formulating ultrashallow junctions using boron as the p+ dopant.

SUMMARY

The invention provides a p-n-p photodiode for an imager cell with an ultrashallow junction depth. The p+ junction layer is doped with a low concentration of indium to decrease transient enhanced diffusion effects, and minimize fixed pattern noise and fill factor loss.

Additional features of the present invention will be apparent from the following detailed description and drawings which illustrate exemplary embodiments of the invention.

DETAILED DESCRIPTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Figure 3:
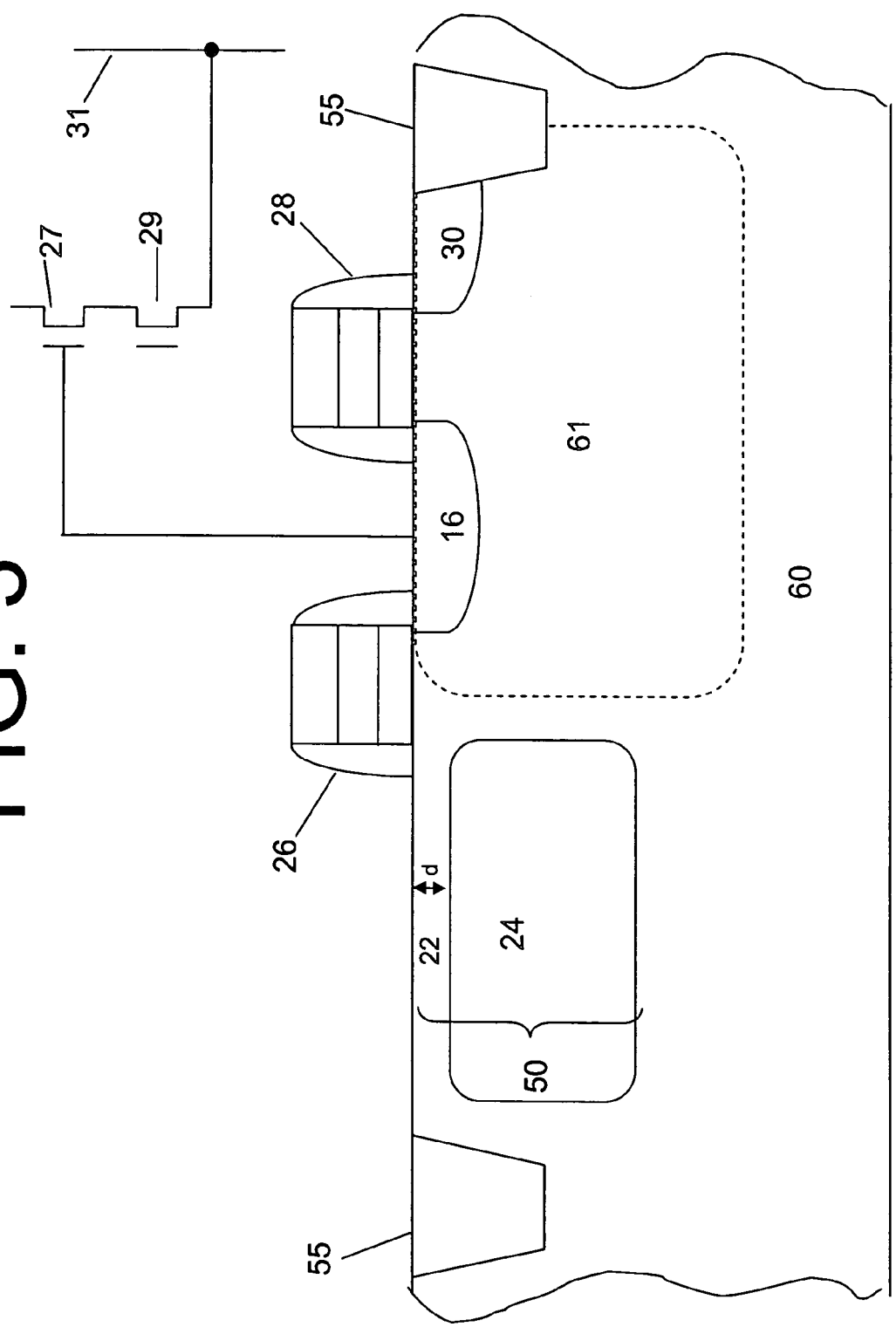
FIG. 3 is a cross-sectional view of an embodiment according to the invention.

In the following description, the invention is described in relation to a CMOS imager for convenience; however, the invention has wider applicability to any photodiode of any imager cell. Now referring to the figures, where like reference numbers designate like elements, FIG. 3 illustrates a pixel sensor cell constructed in accordance with an embodiment of the invention. A photoconversion device 50 is formed in a substrate 60 having a doped layer or well 61, which for exemplary purposes is a p-type well. The photoconversion device is a photodiode and may be a p-n junction photodiode, a Schottky photodiode, or any other suitable photodiode, but for exemplary purposes is discussed as a p-n-p photodiode. In addition and for exemplary purposes only, substrate 60 is a p-type substrate and well 61 is a p-type well more heavily doped than p-type substrate 60.

The exemplary pinned photodiode 50, as shown in FIG. 3, has a p+ region 22 and an n-type region 24. Regions 22 and 24 meet to form a p-n junction at a distance d from the surface of substrate 60. The depth of p+ region 22 is therefore measured form its starting point at the surface of substrate 60 to the p-n junction, and is equal to d. In the exemplary embodiment of FIG. 3, p+ region 22 is implanted at an ultrashallow depth defined as being a region having a depth from a surface of the substrate in the range of about 300 Å to 800 Å, and preferably a depth of about 800 Å. A junction at such a depth is similarly referred to herein as an ultrashallow junction. According to an exemplary embodiment of the invention, the p+ region 22 is implanted with indium atoms in a concentration range of about $1 \times 10^{18}/cm^3$ to $5 \times 10^{18}/cm^3$.

Indium has a heavier mass than other dopants such as boron and thus diffuses less during backend thermal steps of formation. Indium, at this concentration range, therefore has better transient enhanced diffusion characteristics compared to boron. Indium typically acts as an acceptor (p-type) dopant when it occupies a substitutional site in the crystal lattice. However, when indium is in an interstitial site, it acts as a donor (n-type). When implanted into an ultrashallow junction, indium that diffuses into interstitial regions will then act as a donor, thereby reducing fill factor loss and minimizing TED effects. The use of indium also reduces fixed pattern noise by minimizing variations in barrier height and $V_{PIN}$.

The remaining structures shown in FIG. 3 include a transfer transistor with associated gate 26 and a reset transistor with associated gate 28. Source/drain regions 30, floating diffusion region 16 and shallow trench isolation (STI) regions 55 are also shown. A source follower transistor 27 and row select transistor 29 with associated gates are also included in the pixel sensor cell but are not shown in the FIG. 3 cross-sectional view. They are instead depicted in FIG. 3 in electrical schematic form with the output of the row select transistor 29 being connected with a column line 31. Although shown in FIG. 3 as a 4-transistor (4T) configuration with a transfer transistor, the invention can also be utilized in a 3-transistor (3T) configuration, without a transfer transistor, or in other higher number transistor configurations.

Figure 4:
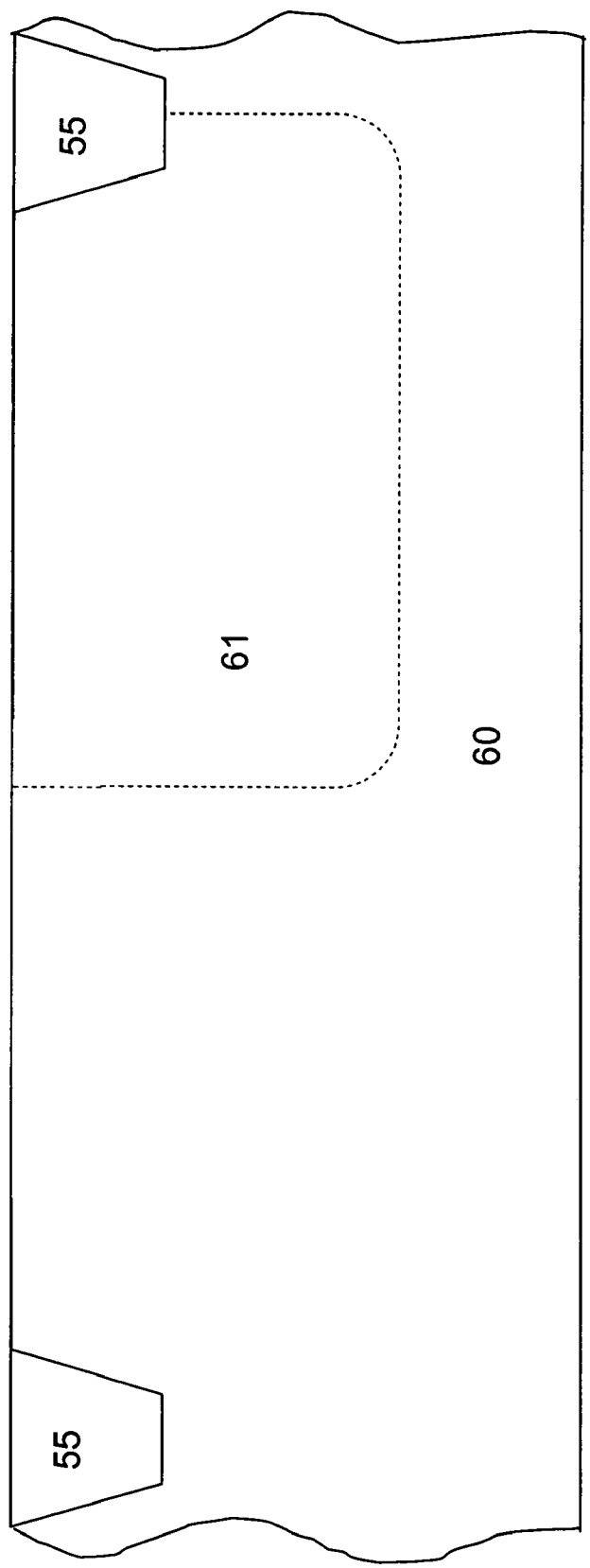
FIG. 4–FIG. 6 show cross-sectional views of a portion of a semiconductor wafer during various stages of processing in accordance with the invention.
Figure 5:
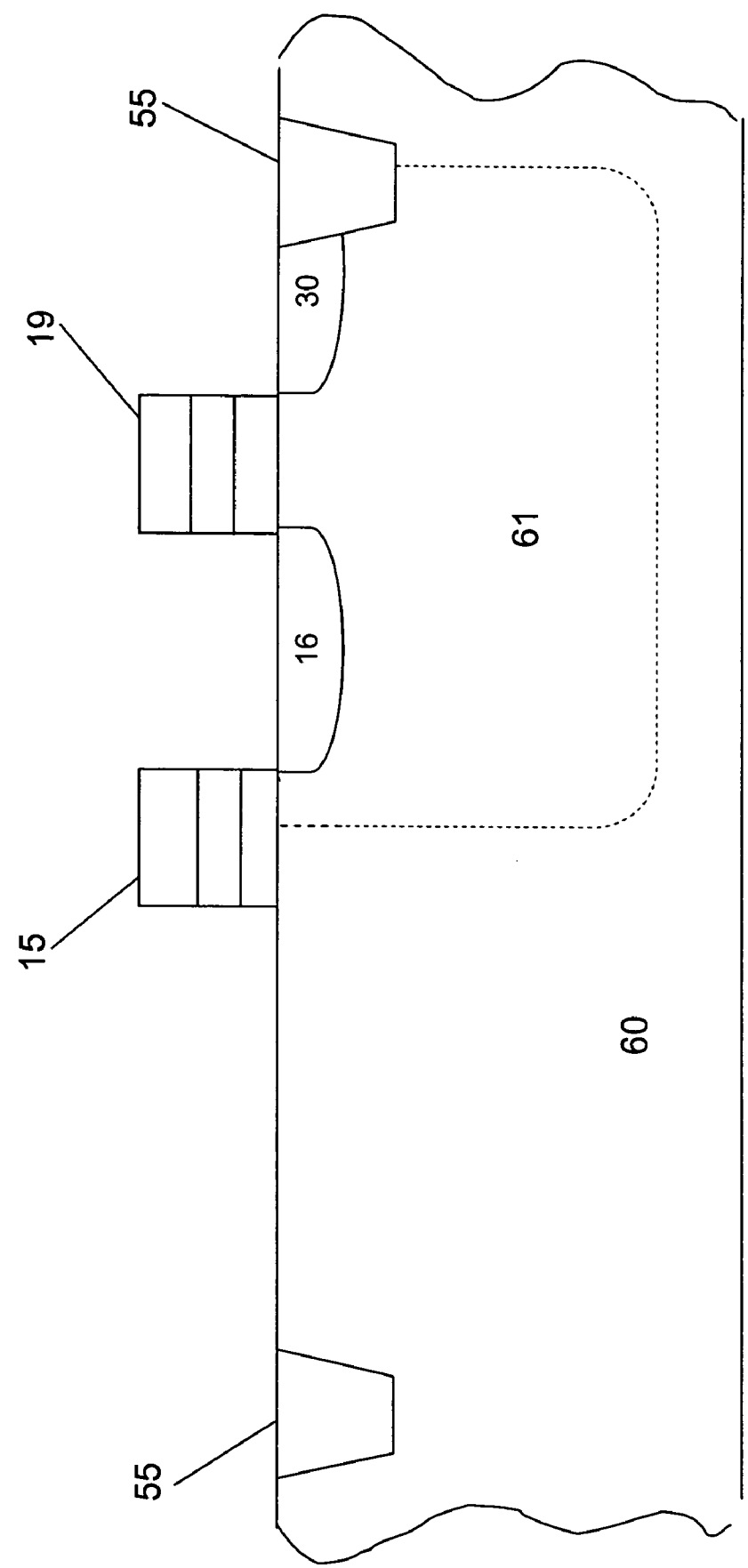
Figure 6:
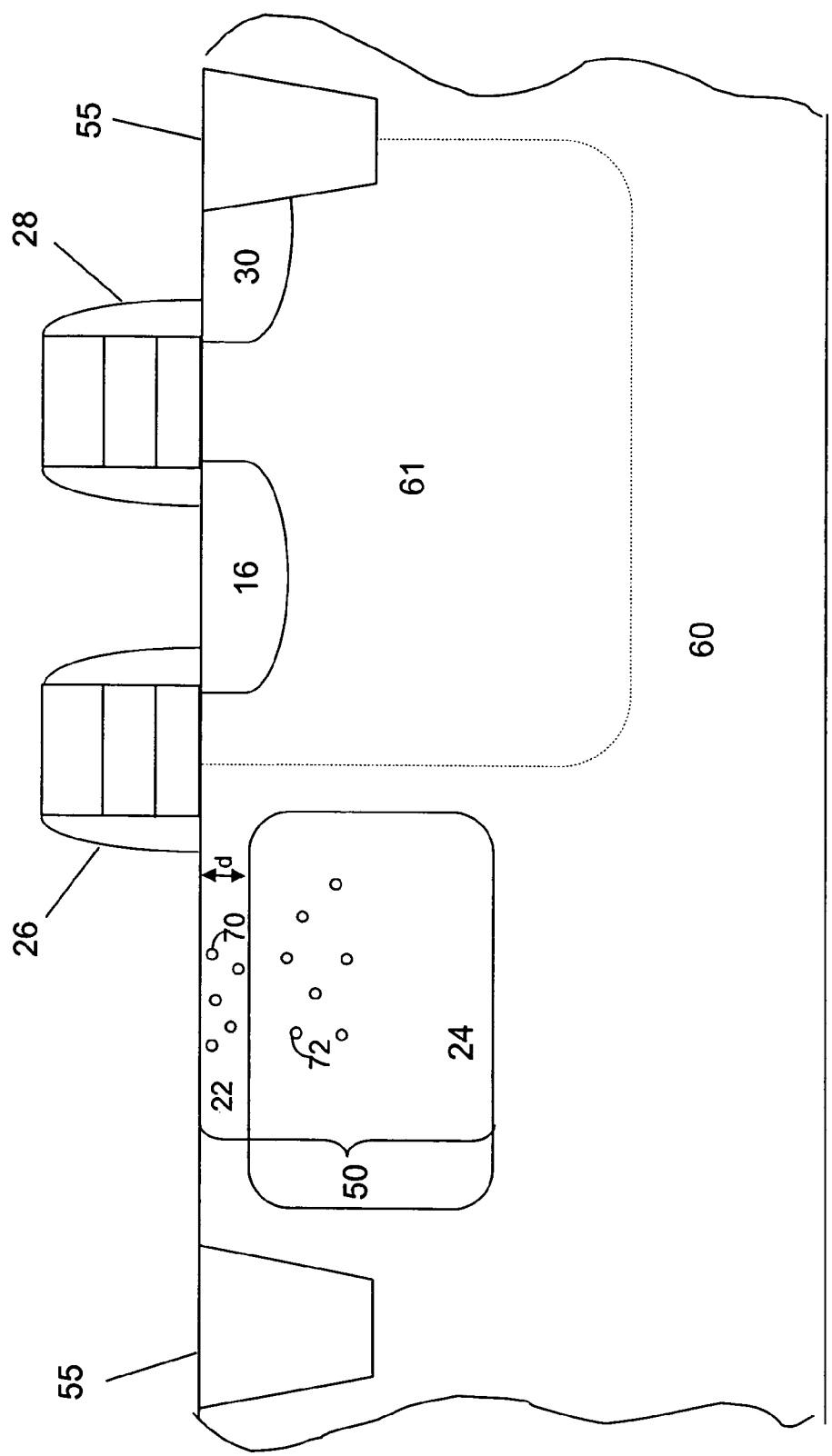

FIGS. 4–6 show one exemplary method of forming a CMOS image sensor with an ultra-shallow p-n-p photodiode in accordance with the present invention at various stages of processing. For convenience, the same cross-sectional view of FIG. 3 is utilized in FIGS. 4–6 for the ensuing description, so the source follower and row select transistors are not illustrated. The invention will be described as formed in a p-well of a p-type substrate; however the invention may also be formed in an n-well in an n-type substrate, and other photosensor structures may also be used.

First a substrate 60, as shown in FIG. 4, is formed. This substrate 60 is a p-type silicon substrate as shown in FIG. 4 with a p-well 61 formed therein. The p-type well 61 may be formed before or after the formation of isolation regions 55 in substrate 60. The p-well implant may be conducted so that the pixel array well 61 and a p-type periphery logic well, which will contain logic circuits for controlling the pixel array, have different doping profiles. As known in the art, multiple high energy implants may be used to tailor the profile of the p-type well 61. The p-well 61 is doped to a higher dopant concentration than the p-type substrate 60.

Isolation regions 55, also shown in FIG. 4, are formed to electrically isolate regions of the substrate where pixel cells will later be formed. The isolation regions 55 can be formed by any known technique such as thermal oxidation of the underlying silicon in a LOCOS process, or by etching trenches and filling them with oxide in an STI (shallow trench isolation) process. Following formation of isolation regions 55 if the p-type well 61 has not yet been formed, it may then be formed by blanket implantation or by masked implantation to produce the p-type well 61.

Next the circuitry of the pixel sensor cell, including the transfer transistor gates; reset transistor gates; the source follower transistor gates; and the row select transistor gates are formed by well-known methods, e.g., blanket deposition of gate oxide, doped polysilicon, deposition of metal for a silicide, annealing to form a silicide, then patterning and etching. FIG. 5 shows an exemplary embodiment with formed gate stacks 15, 19 for transfer transistor 26 and reset transistor 28 respectively. Although shown as a 4-transistor (4T) embodiment, the invention can also be used in a 3-transistor (3T) embodiment or other pixels having five or more transistors.

Floating diffusion region 16 and source/drain regions 30 are also formed after the gate stacks 15, 19. Doped regions 30 and 16, shown in FIG. 5, are formed in the p-well 61 and are doped to an n-type conductivity. For exemplary purposes, doped regions 30, 16, are n+ doped and may be formed by applying a mask to the substrate and doping the regions 30, 16 by ion implantation.

After source/drain regions 30 and floating diffusion region 16 implants are formed, the gate stack sidewall insulators are then formed on the sides of the gate stacks using known techniques. FIG. 6 shows the insulating sidewalls added to the gate stacks for transfer transistor 26 and reset transistor 28. FIG. 6 also shows implantation of the photodiode 50 by methods known in the art. Region 24 is implanted with n-type dopants while a p-type dopant, indium, is implanted to form region 22 an ultrashallow depth, defined as being a region having a depth from a surface of the substrate to a p-n junction in the range of about 300 Å to 800 Å, and preferably a depth of about 800 Å. The doping concentration in region 22 for indium is around $1\times10^{18}/cm^3$ to $5\times10^{18}/cm^3$. A spike anneal with a fast ramp up to a high temperature, for example, 250° C. per second, may be performed after the ion implantation in order to improve the transient enhanced diffusion characteristics of the indium implant.

FIG. 6 also illustrates schematically a number of indium ions in photodiode 50 in the silicon crystal lattice of substrate 60. Indium ion 70 is illustratively one of a number of ions in region 22, while indium ion 72 is illustratively one of a number of ions in region 24. Indium ion 70 and other indium ions in region 22 occupy substitutional sites in the lattice and therefore act as acceptors of electrons. Indium ion 72 and other indium ions that diffuse into the n-type region 24 occupy interstitial sites and act as donors. Since indium ions can act as acceptors in region 22 and donors in region 24, the fill factor of the pixel cell is thereby increased.

The pixel sensor cell is essentially complete at this stage, and conventional processing methods may be used to form insulating, shielding, and metallization layers to connect gate lines and other connections to the pixel sensor cells. For example, the entire surface may be covered with a passivation layer 88 of, for example, silicon dioxide, BSG, PSG, or BPSG, which is CMP planarized and etched to provide contact holes, which are then metallized to provide contacts. Conventional layers of conductors and insulators may also be used to interconnect the structures and to connect the pixel to peripheral circuitry.

Figure 1:
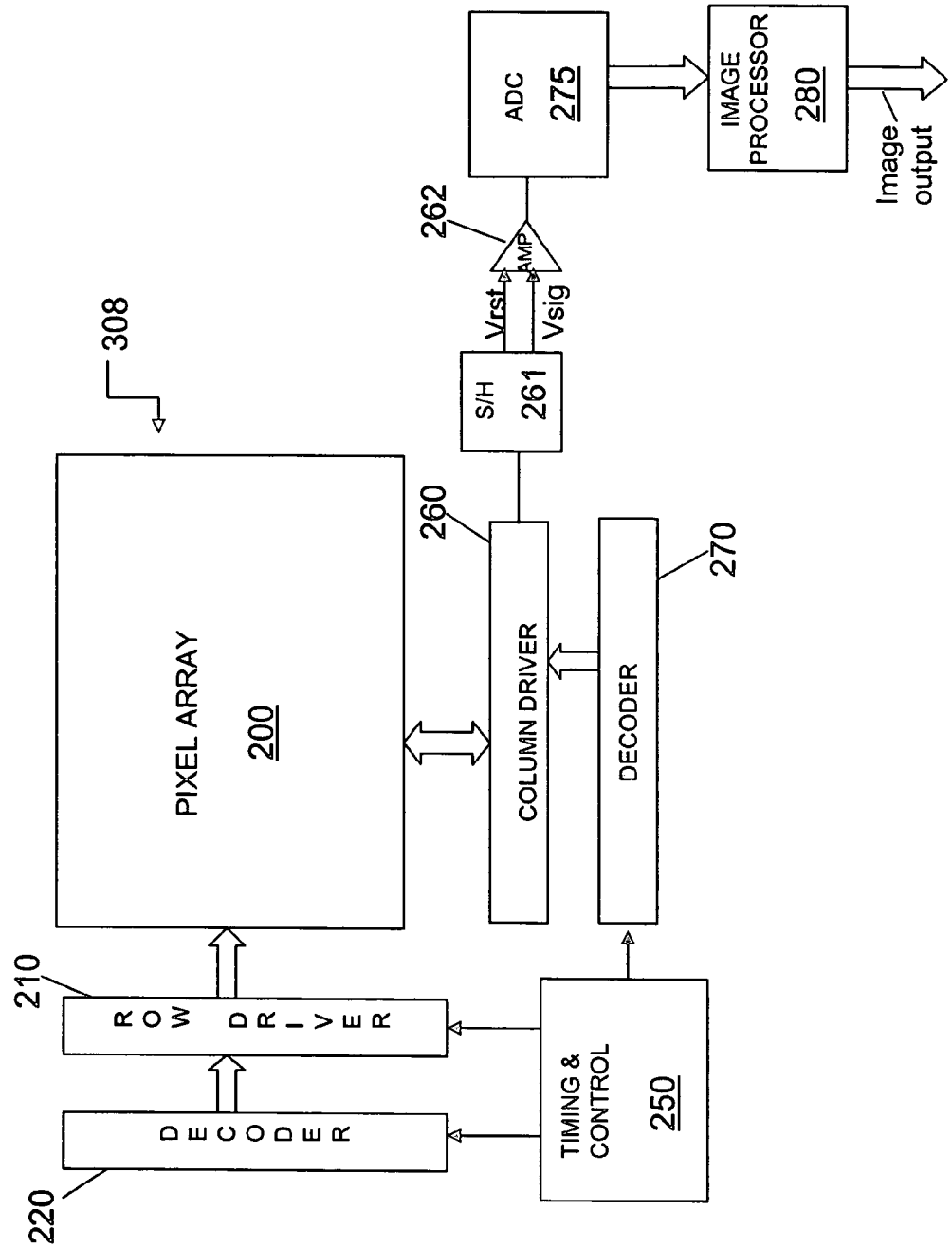
FIG. 1 is a block diagram of a conventional CMOS imager chip having a pixel array.
Figure 2:
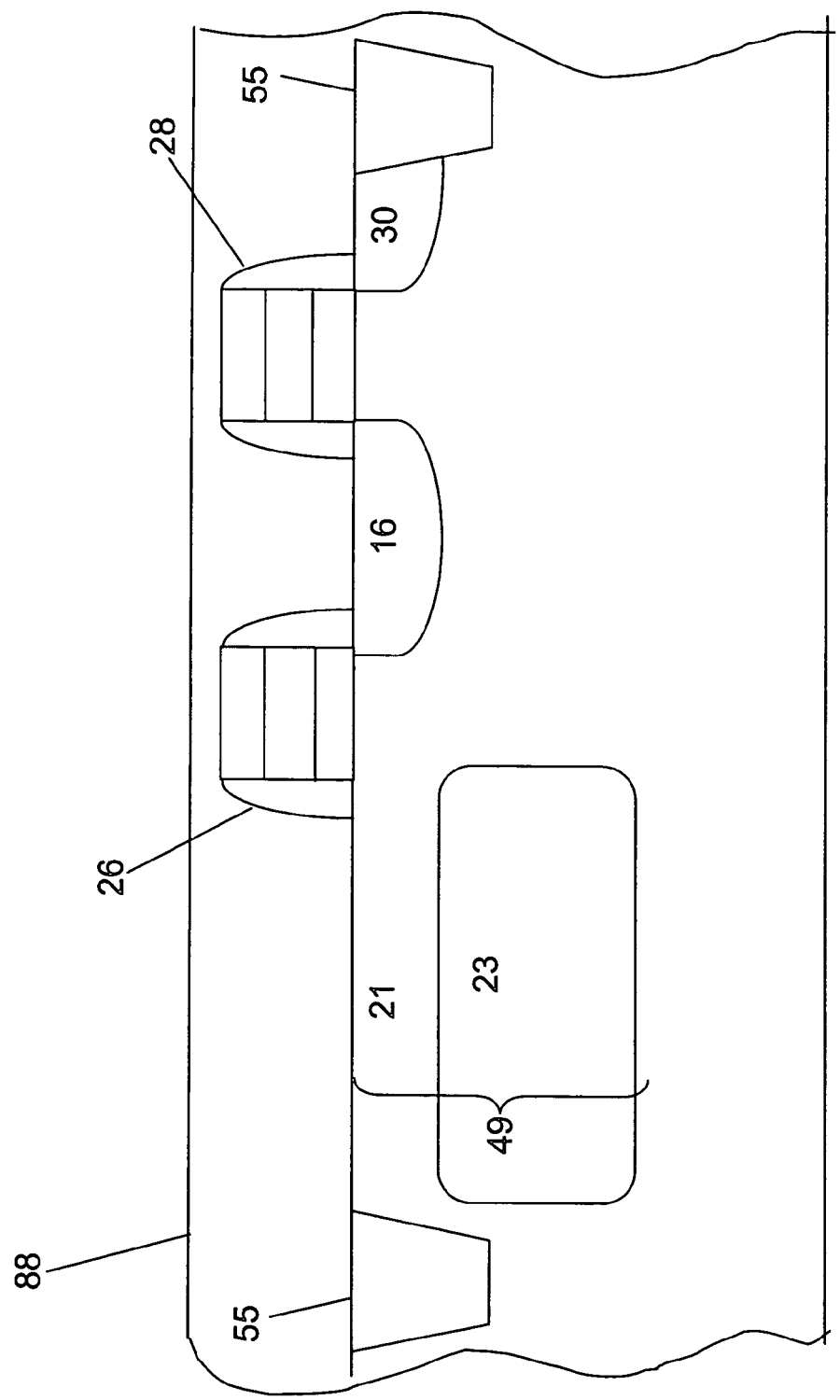
FIG. 2 is a cross-sectional view of a conventional pixel sensor cell having a p-n-p photodiode.
Figure 7:
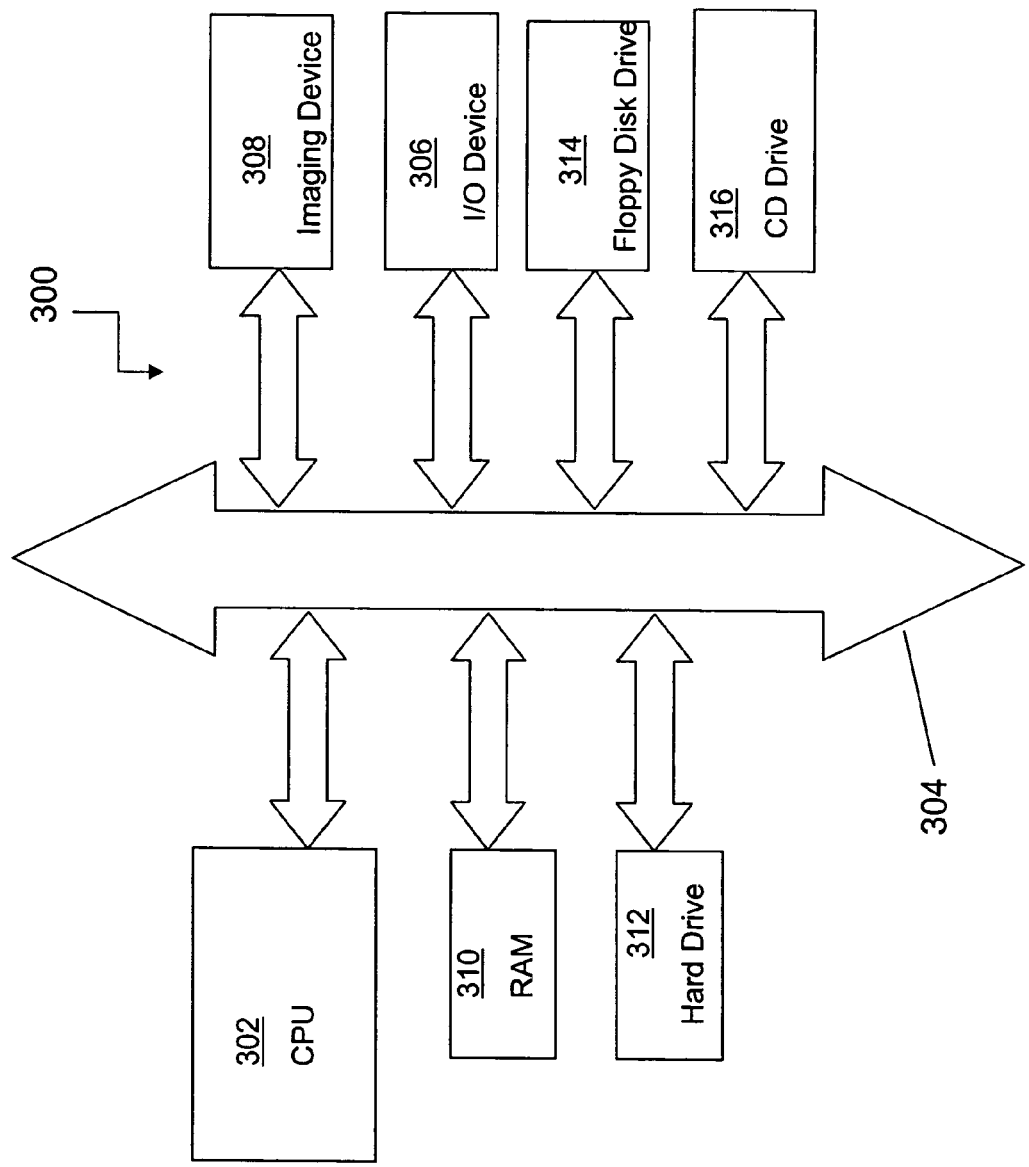
FIG. 7 is a schematic diagram of a processing system employing a CMOS imager having photodiodes constructed in accordance with the present invention.

FIG. 7 shows a processor system 300, which includes an imager device 308 having the overall structure of FIG. 1, but having an array of pixels constructed in accordance with the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixel array 200 having the characteristics of the invention as described above in connection with FIGS. 3–6. The imager device 308 may, in turn, be coupled to processor 302 for image processing, or other image handling operations.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A photoconversion device comprising:
   a substrate having a surface;
   a first doped region having a first conductivity type and located below the surface of the substrate at an ultrashallow depth, wherein said first doped region is doped with indium; and
   a second doped region having a second conductivity type located beneath said first doped region for producing photogenerated charges,
   wherein said first doped region is implanted to a depth of about 800 Å.

2. A photoconversion device comprising:
   a substrate having a surface;
   a first doped region having a first conductivity type and located below the surface of the substrate at an ultrashallow depth;
   a second doped region having a second conductivity type located beneath said first doped region for producing photogenerated charges; and
   the first and second doped regions both including indium ions, the indium ions in the first region acting as electron acceptors, the indium ions in the second region acting as electron donors.

3. The system according to claim 2 wherein said first conductivity type is p-type.

4. The photoconversion device of claim 2 wherein said first doped region is implanted with indium to a depth of about 800 Å.

5. The photoconversion device of claim 2 wherein the concentration of said indium dopant is in the range of about $1 \times 10^{18}/cm^3$ to $5 \times 10^{18}/cm^3$.

6. A photo diode comprising:
 a substrate having a surface;
 a first doped region having a first conductivity type and located below the surface of the substrate at an ultrashallow depth; and
 a second doped region having a second conductivity type located beneath said first doped region; and
 the first and second doped regions both including indium ions, the indium ions in the first region acting as electron acceptors, the indium ions in the second region acting as electron donors,
 wherein the second doped region collects photo diode generated charges.

7. The diode of claim 6 wherein said first conductivity type is p-type.

8. The diode of claim 6 wherein said first doped region is implanted to a depth in the range of about 800 Å.

9. The diode of claim 6 wherein the concentration of said indium dopant is in the range of about $1 \times 10^{18}/cm^3$ to $5 \times 10^{18}/cm^3$.

10. A processing system comprising:
 a processor; and
 an imager coupled to said processor, said imager comprising:
 a substrate having a surface;
 a photosensitive area within said substrate for accumulating photo generated charge in said area, said photosensitive area having a first doped region having a first conductivity type and located below the surface of the substrate at an ultrashallow depth and a second doped region having a second conductivity type located beneath said first doped region; and
 a readout circuit comprising at least an output transistor formed on said substrate,
 wherein said first and second doped regions are doped with indium.

11. The system according to claim 10 wherein said first conductivity type is p-type.

12. The system according to claim 10 wherein said first doped region is implanted to a depth in the range of about 800 Å.

13. The system according to claim 10 wherein the concentration of said indium dopant is in the range of about $1 \times 10^{18}/cm^3$ to $5 \times 10^{18}/cm^3$.

14. An imager comprising:
 a substrate having a surface;
 an array of pixel sensor cells formed on said substrate; each pixel sensor cell comprising:
 a photosensitive area within said substrate for accumulating photo generated charge in said area, said photosensitive area having a first doped region having a first conductivity type and located below the surface of the substrate at an ultrashallow depth and a second doped region having a second conductivity type located beneath said first doped region; and
 signal processing circuitry formed in said substrate and electrically connected to the array for receiving and processing signals representing an image output by pixels of the array and for providing output data representing said image,
 wherein said first and second doped regions are doped with indium.

15. The imager according to claim 14 wherein said first conductivity type is p-type.

16. The imager according to claim 14 wherein said first doped region is implanted to a depth in the range of about 800 Å.

17. The imager according to claim 14 wherein the concentration of said indium dopant is in the range of about $1 \times 10^{18}/cm^3$ to $5 \times 10^{18}/cm^3$.

\* \* \* \* \*